(12) United States Patent
Wanat et al.

(10) Patent No.: US 6,512,087 B1
(45) Date of Patent: Jan. 28, 2003

(54) FRACTIONATION OF RESINS USING A STATIC MIXER AND A LIQUID-LIQUID CENTRIFUGE

(75) Inventors: Stanley F. Wanat, Scotch Plains, NJ (US); M. Dalil Rahman, Flemington, NJ (US); Zhong Xiang, Somerset, NJ (US)

(73) Assignee: Clariant Finance (BVI) Limited (VG)

( * ) Notice: Subject to any disclaimer, the term of this patent is extended or adjusted under 35 U.S.C. 154(b) by 0 days.

(21) Appl. No.: 09/698,724

(22) Filed: Oct. 27, 2000

Related U.S. Application Data

(63) Continuation-in-part of application No. 09/687,137, filed on Oct. 13, 2000.

(51) Int. Cl.[7] .............................. C08F 6/04; G03F 7/023
(52) U.S. Cl. ................... 528/502 D; 528/129; 528/148; 430/192; 430/193; 210/634
(58) Field of Search .............................. 430/270–1, 192, 430/193, 325, 326, 330; 528/148, 129, 502 D; 210/634

(56) References Cited

U.S. PATENT DOCUMENTS

| | | | |
|---|---|---|---|
| 5,521,052 A | | 5/1996 | Rahman et al. .......... 430/270.1 |
| 5,736,292 A | * | 4/1998 | Ida et al. .................... 430/165 |
| 5,747,218 A | * | 5/1998 | Momota et al. ............ 430/191 |
| 5,863,700 A | * | 1/1999 | Rahman et al. ............. 430/168 |
| 5,910,599 A | | 6/1999 | Tanaka et al. ................ 556/76 |
| 6,121,412 A | * | 9/2000 | Wanat et al. ................ 210/634 |
| 6,297,352 B1 | * | 10/2001 | Wanat et al. ............. 430/270.1 |

FOREIGN PATENT DOCUMENTS

| | | |
|---|---|---|
| WO | WO/0033137 | 6/2000 |

OTHER PUBLICATIONS

JP 09241345, Tomita Shoji, Abstract entitled "Production of Phenol Resin", published Sep. 16, 1997, publication No. 09241345.

Balaji Narasimhan et al, "Novel Strategies for Novolak Resin Fractionation: Consequences for Advanced Photoresist Applications", XP–000969808, Polymer Engineering and Science, Oct. 2000, vol. 40, No. 10, pp. 2251–2261.

* cited by examiner

*Primary Examiner*—John S. Chu
(74) *Attorney, Agent, or Firm*—Krishna G. Banerjee

(57) ABSTRACT

Disclosed is a method for producing low molecular weight oligomers of a film forming resin, which involves: a) providing a solution of the film forming resin in a first solvent system comprising a photoresist solvent, and optionally a water-soluble organic solvent; b) providing a second solvent system comprising at least one substantially pure $C_5$–$C_8$ alkane and/or at least one aromatic compound having at least one hydrocarbyl substituent and/or water/$C_1$–$C_4$ alcohol mixture; and performing steps c)–e) in the following order: c) mixing the solutions from a) and second solvent system from b) in a static mixer for a time period sufficient for efficient mixing; d) feeding the mixture from c) and second solvent system from b) through two separate inlet ports into a liquid/liquid centrifuge, one of the inlet ports feeding the mixture from c), the second inlet port feeding the second solvent system from b) into said liquid/liquid centrifuge at a feed ratio of the mixture from c) to the second solvent system from b) of from about 10/90 to about 90/10, at a temperature of from about 0° C. up to maximum temperature that is less than the boiling point of the lowest boiling solvent in the first or second solvent system; e) rotating the mixture from step d) inside the liquid/liquid centrifuge at a rotational speed sufficient to separate the mixture from step d) into two separate phases, and then collecting the two separate phases, each from two separate outlet ports, into two separate containers, wherein the heavier phase (H) comprises a fractionated film forming resin comprising higher molecular weight fractions of the film forming resin and the lighter phase (L) comprises low molecular weight oligomers of the film forming resin. The present invention also provides a method for producing a photoresist composition, and method for producing a microelectronic device using the aforementioned fractionated resin or low molecular weight oligomers of the film forming resin.

15 Claims, 3 Drawing Sheets

FRACTIONATION OF RESINS USING A STATIC MIXER AND A LIQUID-LIQUID CENTRIFUGE

This is a continuation in part of application Ser. No. 09/687,137, filed Oct. 13, 2000

BACKGROUND OF THE INVENTION

The present invention provides a process for separating low molecular weight oligomers of a film forming resin utilizing the combination of a static mixer and a liquid—liquid centrifuge. The low molecular weight oligomers are useful in enhancing the photospeed of a photoresist composition. Furthermore, derivatives of these low molecular weight oligomers (such as esterified products of the oligomers with diazonaphthaquinone compounds) are themselves photoactive and can be used in a photoresist composition. As such, the present invention also provides a process for producing a photoresist composition comprising said low molecular oligomers or derivatives of said low molecular weight oligomers. The present invention also provides a process for producing a semiconductor device by forming an image on a substrate utilizing the foregoing low molecular oligomers or their derivatives.

Fractionation reduces the overall yield of a resin by removing low molecular weight materials (such as unreacted monomers, dimers, trimers and intermediate oligomers). Depending upon the functional properties needed for the final resist, many fractionation techniques can be devised for the general removal of a broad range of these lower molecular weight fractions and intermediate oligomers. Economically, the cost of the raw material is directly related to the yield of useful resin obtained from the fractionation steps. It would be desirable to selectively remove those fractions that are known in a particular technical application to affect functional properties of a final resist composition without substantial lowering the overall yields of the film forming resin. The present invention affords such a process for selective removal of oligomeric fractions of a film forming resin. For example, in the preparation of microelectronic devices, multiple high temperature baking steps may be used to a) remove solvents immediately after spin coating the liquid resist composition onto a semi-conductor substrate and a post development bake after the wafer is imaged through a photomask. Other heat treatment steps may be optionally applied to further remove entrained solvents or to facilitate heat activated chemical changes in the coated film. Serious defects can occur in some of these heat treatment steps when low molecular weight oligomers of a film forming resin, such as dimers and trimers of a novolak resin, volatilize, and either affect film integrity or, more commonly, sublime on the inside of the processing equipment. It would be desirable to remove substantial portions of the low molecular oligomers of a film forming resin, such as dimers/trimers of a novolak resin, while retaining a high yield of the remaining film forming resin. The present invention affords a method for the selective removal of such dimers and trimer fractions of the film forming resin. While distillation methods can be used to remove volatile materials such as low molecular weight oligomers, these methods are batch processes and require long set-up times and cleaning steps, and the yield of the resulting fractionated resin is also low. These disadvantages are lacking in the present invention. In the present invention, by the combined use of a static mixer and liquid/liquid centrifuge fractionation process, one can continuously remove low molecular weight oligomeric fractions, such as dimers and trimers of a film forming resin, while maintaining a high yield of the desired fractionated film forming resin.

Photoresist compositions are used in microlithography processes for making miniaturized electronic components, such as in the fabrication of computer chips and integrated circuits. Generally, in these processes, a thin coating of a film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate.

U.S. Pat. No. 6,121,412 and International Publication WO 00/33137 disclose a method for producing a film forming, fractionated novolak resin, by: a) condensing formaldehyde with one or more phenolic compounds, and thereby producing a novolak resin; b) adding a photoresist solvent, and optionally a water soluble organic polar solvent; c) feeding the mixture into a liquid/liquid centrifuge and feeding a $C_5$–$C_8$ alkane, water or aromatic hydrocarbon solvent into the liquid/liquid centrifuge at a ratio of optional water-soluble organic polar solvent and photoresist solvent to $C_5$–$C_8$ alkane, water or aromatic solvent, of from 5:1 to 0.5:1; d) rotating the liquid/liquid centrifuge containing the mixture at a speed of at least 500 rpm and thereby separating the mixture into two phases, collecting the two phases; e) optionally separating the lighter phase (L) into two second phases; f) removing residual $C_5$–$C_8$ alkane, water or aromatic hydrocarbon solvent from the heavier phase (H) from step d) and leaving the novolak resin dissolved in the photoresist solvent. A method is also provided in these references for producing photoresist composition from such a fractionated novolak resin and for producing microelectronic devices using such a photoresist composition.

SUMMARY OF THE INVENTION

The present invention provides a method for separating and isolating low molecular weight oligomers of a film forming resin, said method comprising:

c) providing a solution of the film forming resin in a first solvent system comprising a photoresist solvent, and optionally a water-soluble organic polar solvent, wherein the ratio of the photoresist solvent to the water soluble organic polar solvent ranges from about 10/90 to about 100/0;

b) providing a second solvent system comprising at least one substantially pure $C_5$–$C_8$ alkane and/or at least one alkyl aromatic compound having at least one hydrocarbyl substituent and/or water/$C_1$–$C_4$ alcohol mixture provided that the $C_1$–$C_4$ alcohol content of the water/$C_1$–$C_4$ alcohol mixture is less than 50% by weight; and performing steps c)–e) below in the following order:

c) mixing the solutions from a) and the second solvent system from b) in a static mixer for a time period sufficient for efficient mixing;

d) feeding the mixture from c) and the second solvent system from b) through two separate inlet ports into a liquid/liquid centrifuge, one of said inlet ports feeding the mixture from c), the second inlet port feeding the second solvent system from b) into said liquid/liquid centrifuge at a feed ratio of the mixture from c) to the second solvent system from b) of from about 10/90 to about 90/10, at a temperature of from about 0° C. up to a maximum temperature that is less than the boiling point of the lowest boiling solvent in the first or second solvent system;

e) rotating the mixture from step d) inside the liquid/liquid centrifuge at a rotational speed sufficient to separate the mixture from step d) into two separate phases, and then collecting the two separate phases, each from two separate outlet ports, into two separate containers, wherein the heavier phase (H) comprises higher molecular weight fractions of film forming resin, in the first solvent system with a minor amount of the second solvent system, and the lighter phase (L) comprises low molecular weight oligomers of the film forming resin in the second solvent system with a minor amount of the first solvent system.

The present invention also provides a method for producing a photoresist composition, said method comprising: providing an admixture of: 1) a fractionated film forming resin comprising higher molecular weight fractions of the film forming resin, said fractionated film forming resin produced according to the aforementioned method; 2) a photosensitive component in an amount sufficient to photosensitize a photoresist composition; and 3) an additional photoresist solvent to form the photoresist composition.

The present invention also provides a method for producing a photoresist composition, said method comprising: providing an admixture of 1) a film forming resin; 2) a photosensitive component in an amount sufficient to photosensitive the photoresist composition; 3) a speed enhancing composition comprising low molecular weight oligomers of a film forming resin made by the aforementioned method; and 4) a photoresist solvent; to form the photoresist composition.

The present invention further provides a method for producing a photoresist composition, comprising: providing an admixture of: 1) a film forming resin; 2) a photosensitive component in an amount sufficient to photosensitize the photoresist composition, said photosensitive component comprising an ester made by reacting the low molecular weight oligomers of a film forming resin having reactive hydroxyl groups, said low molecular weight oligomers made by the aforementioned method, with a diazonaphthoquinone sulfonyl chloride; and 4) a photoresist solvent; to form the photoresist composition.

The present invention also provides a method for producing a microelectronic device by forming an image on a substrate, said method comprising: a) providing any of the aforementioned photoresist compositions; b) thereafter, coating a suitable substrate with the photoresist composition from step a); c) thereafter, heat treating the coated substrate until substantially all of solvent is removed; image-wise exposing the coated substrate; and then removing the image-wise exposed or, alternatively, the unexposed areas of the coated substrate with a suitable developer.

Figure 1:
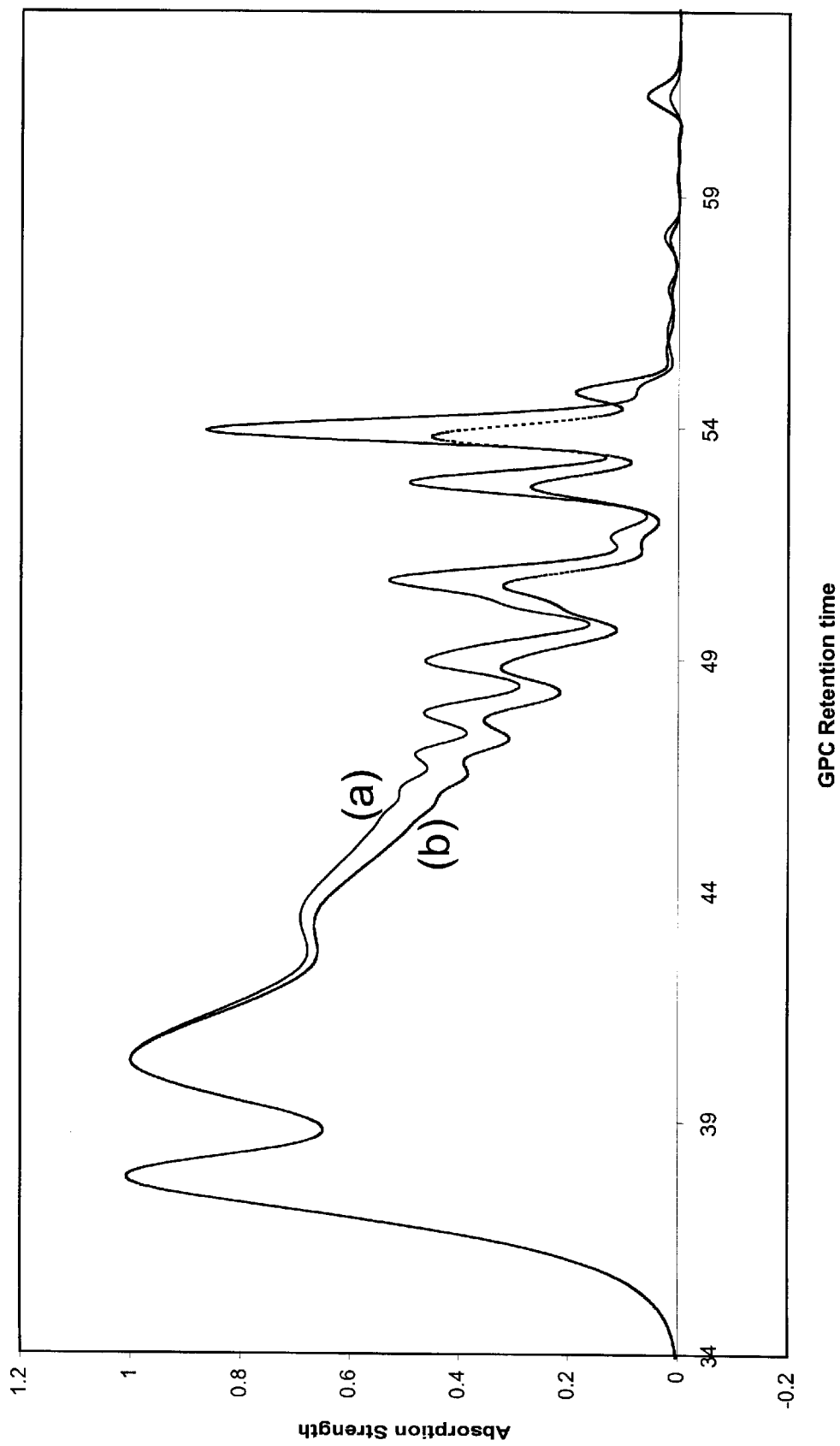
FIG. 1 shows the GPC traces of an unfractionated novolak resin (a), and a fractionated novolak resin (b), obtained using a static mixer of the present invention, and using hexanes as the second solvent system of the present invention.

DETAILED DESCRIPTION OF THE INVENTION (a) Providing a Solution of the Film Forming Resin One step of the present method for producing low molecular weight oligomers of a film forming resin involves providing a solution of the film forming resin in a first solvent system comprising a photoresist solvent, and optionally a water-soluble organic polar solvent, wherein the ratio of the photoresist solvent to the water soluble organic polar solvent ranges from about 10/90 to 100/0, and in one embodiment from 10/90 to 70/30, and in one embodiment from 30/70 to 60/40.

Preferably, the film-forming resin is a polymer that is useful in making photoresists. Nonlimiting examples of suitable resins are novolak resins, vinylphenol polymers and derivatives thereof. Novolak resins have been commonly used in the art of photoresist manufacture as exemplified by "Chemistry and Application of Phenolic Resins", Knop A. and Scheib, W.; Springer Verlag, New York, 1979 in Chapter 4. These resins are typically produced by a condensation reaction between formaldehyde or a reactive equivalent thereof, such paraformaldehyde and formalin, and one or more phenolic compounds, such as m-cresol, p-cresol, 2,4- and 2,5-dimethylphenol, 3,5-dimethylphenol, and 2,3,5-trimethylphenol. The condensation reaction is preferably carried out in the presence of an acid catalyst or a reactive equivalent of said acid catalyst. As used herein, the phrase "reactive equivalent" of a material means any compound or chemical composition other than the material itself which reacts or behaves like the material itself under the reaction conditions. Thus reactive equivalents of a carboxylic acid will include acid-producing derivatives such as an anhydride, an acyl halide, and mixtures thereof unless specifically stated otherwise. Examples of suitable acid catalysts include oxalic acid, maleic acid, or maleic anhydride, p-toluenesulfonic acid and sulfuric acid.

Suitable examples of the photoresist solvent include without limitation propylene glycol methyl ether acetate (PGMEA), 3-methoxy-3-methyl butanol, 2-heptanone (methyl amyl ketone), ethylene glycol monomethyl ether, ethylene glycol monoethyl ether, diethylene glycol monoethyl ether, ethylene glycol monoethyl ether acetate, ethylene glycol monomethyl acetate; a monooxymonocarboxylic acid ester, such as methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, ethoxy ethyl propionate, methyl 3-oxypropionate, ethyl 3-oxypropionate, methyl 3-methoxypropionate, ethyl 3-methoxypropionate, methyl 2-oxypropionate, ethyl 2-oxypropionate, ethyl 2-hydroxypropionate (ethyl lactate), ethyl 3-hydroxypropionate, propyl 2-oxypropionate, methyl 2-ethoxypropionate, propyl 2-methoxy propionate, and mixtures thereof.

Suitable examples of the water-soluble organic polar solvent include without limitation acetone, dimethylformamide (DMF), dimethylsulfoxide (DMS), tetrahydrofuran (THF), ethylene glycol, a $C_1$–$C_5$, (preferably $C_1$–$C_3$) alkyl alcohol, such as methanol, ethanol, and propanol.

(b) Providing a Second Solvent System

Another step of the present method involves providing a second solvent system comprising (i) at least one substantially pure $C_5$–$C_8$ alkane (such as pentane, hexane, and heptane) and/or (ii) at least one aromatic compound having at least one hydrocarbyl substituent and/or (iii) water/alcohol mixture provided that alcohol content of the water/alcohol mixture is less than 50% by weight Examples of suitable aromatic compounds include without limitation toluene, dimethylbenzene, and dibutylbenzene.

As used herein, the term "hydrocarbyl substituent" or "hydrocarbyl group" is used in its ordinary sense, which is well known to those skilled in the art. Specifically, it refers to a group having a carbon atom directly attached to the remainder of the molecule and having predominantly hydrocarbon character. Examples of hydrocarbyl groups include:

(1) hydrocarbon substituents, that is, aliphatic (e.g., alkyl or alkenyl), alicyclic (e.g., cycloalkyl, cycloalkenyl) substituents, and aromatic-, aliphatic-, and alicyclic-substituted aromatic substituents, as well as cyclic substituents wherein the ring is completed through another portion of the molecule (e.g., two substituents together form an alicyclic radical);

(2) substituted hydrocarbon substituents, that is, substituents containing non-hydrocarbon groups which, in the context of this invention, do not alter the predominantly hydrocarbon substituent (e.g., halo (especially chloro and fluoro), hydroxy, alkoxy, mercapto, alkylmercapto, nitro, nitroso, and sulfoxy);

(3) hetero substituents, that is, substituents which, while having a predominantly hydrocarbon character, in the context of this invention, contain other than carbon in a ring or chain otherwise composed of carbon atoms. Heteroatoms include sulfur, oxygen, nitrogen, and encompass substituents as pyridyl, furyl, thienyl and imidazolyl. In general, no more than two, preferably no more than one, non-hydrocarbon substituent will be present for every ten carbon atoms in the hydrocarbyl group; typically, there will be no non-hydrocarbon substituents in the hydrocarbyl group (c) Mixing the Solutions From (a) and the Solvent From (b) in a Static Mixer Another step of the present method involves mixing the solution from a) and the solvent from b) in a static mixer for a time period sufficient for efficient mixing to form a mixture. The present invention envisions the use of both an in-line and out-of-line motorized mixers; however in-line mixers are preferred, as these offer the prospects of a continuous process.

In line mixers can be economical, long-lasting and more convenient than most motorized mixers. In an in-line mixer, instead of mixing fluids with a motorized mixer before pumping them through a pipe line, one can mix fluids as one pumps them through a pipe line. In-line mixers prevent overmixing and undermixing, and resist fouling in the pipes and tubes. They are virtually maintenance free and need no spare parts.

In line mixers provide efficient mixing and can withstand large pressure changes-up to 1500 psi with smallest sizes. Mixing elements in pipe and tube mixers are securely attached to the mixer wall, so internal pressure changes cannot collapse elements and stop flow. With in-line static mixers, the mixer does not move through the fluid-the fluid moves through the mixer. Various types of commercial in-line mixers are available from commercial vendors (such as Cole-Parmer).

In one embodiment, the time period for efficient mixing is at least 6 seconds, and in one embodiment at least 30 seconds.

d) Feeding Mixture From c) and Solvent From b) into liquid-liquid Centrifuge

The mixture from c) and the second solvent from step b) are next fed through two separate inlet ports into a liquid/liquid centrifuge, one of said inlet ports feeding the mixture from step c), the second inlet port feeding the second solvent system from step b) into the liquid/liquid centrifuge at a feed rate ratio of the mixture from step c) to the second solvent system from step b) of from 10/90 to 90/10, and in one embodiment 65/35 to 35/65, at a temperature of from 0° C. up to a maximum temperature that is less than the boiling point of the lowest boiling solvent in the first or second solvent system. In one embodiment, the temperature ranges from 10° to 20° less than the boiling point of the lowest boiling water-imiscible solvent. In one embodiment, the actual temperature of feeding is 70–80° C.

In one embodiment, the mixture from c) and the solvent system from b) are fed into the centrifuge by being pumped (such as using a peristaltic or metering pump) through the inlet feed ports. The centrifuge can be any liquid/liquid centrifuge capable of performing the specified steps. In one embodiment, the liquid/liquid centrifuge used is a CINC™ Model V-2 liquid/liquid centrifuge (Available from CINC, Carson City, Nev; web site: http://www.cinc-co.com). This liquid/liquid centrifuge uses centrifugal force to separate immiscible liquids of different densities. The unit is comprised of a metal housing and stand, with inlet and outlet ports, an observation window, a rotor (its only moving part), and a motor connected to the rotor via a flexible, direct coupling. An AC inverter drive controller provides for precise control of the rotor speed. The fluids are homogenized in an annular mixing zone, and then directed by bottom vanes towards a rotor inlet. For applications, where premixing is not beneficial, an inner sleeve can be installed which limits contact of the fluids with the rotating rotor (i.e. two different mixing heads corresponding to different shear forces are available for this unit). Centrifugal forces in the range of 100–400 g's can be generated by this centrifuge.

e) Rotating the Mixture in the Centrifuge

The next step of the present method involves rotating the mixture from step d) inside the liquid/liquid centrifuge at a rotational speed sufficient to separate the mixture from step d) into two separate phases, and thereafter collecting the two separate phases, each through a separate outlet port, into two separate containers, wherein the heavier phase (H) comprises the higher molecular weight fractions of the film-forming resin in the first solvent system, with a minor amount (such as 10–20%) of the second solvent system, and the lighter phase (L) comprises low molecular weight oligomers of the film forming resin in the second solvent system with a minor amount (such as 10–20%) of the first solvent system. Typically, the low molecular weight oligomers comprise a mixture of oligomers, such as dimers, trimers, tetramers, pentamers, hexamers, heptamers, octamers, nonamers and decamers, containing various monomeric repeat units. In one embodiment, the dimers and trimers comprise at least 20%, and in one embodiment at least 30%, and in one embodiment at least 40% by weight of the low molecular weight oligomers.

In one embodiment, the mixture is rotated at a speed of at least 500 revolutions per minute (rpm), preferably from 500 to 50,000 rpm, most preferably from 1,000 to 30,000 rpm.

In one embodiment, the second solvent system in the lighter phase (L) is removed by distillation to afford the low molecular weight oligomers dissolved in the first solvent. The solution of the low molecular weight oligomers in the first solvent system can be used directly in the formulation of a photoresist composition.

In one embodiment of the present invention, the heavier phase (H) comprising the higher molecular weight fractions of the film-forming resin in the first solvent system is recycled through the centrifuge along with the second solvent system to improve the yield of the low molecular weight oligomers in the isolated lighter phase. However, caution must be exercised in that additional iterations of this recycling can cause the film forming resin to be further fractionated. That is, further iterations of the recycling step can remove higher molecular weight oligomers from the film forming resin, causing the lighter phase (L) to contain both low molecular weight (typically dimers to decamers) as well as higher molecular weight oligomers.

Methods for Producing Photoresist Compositions

The present invention also provides a method for producing a photoresist composition, said method comprising: providing an admixture of: 1) a fractionated film forming resin comprising higher molecular weight fractions of the film forming resin, said fractionated film forming resin produced according to the aforementioned method utilizing the static mixer and the liquid/liquid centrifuge; 2) a photosensitive component in an amount sufficient to photosensitize a photoresist composition; and 3) an additional photoresist solvent; to form the photoresist composition.

The present invention also provides a method for producing a photoresist composition, said method comprising: providing an admixture of: 1) a film forming resin; 2) a photosensitive component in an amount sufficient to photosensitize the photoresist composition; 3) a speed enhancing composition comprising low molecular weight oligomers of a film forming resin made by the aforementioned method involving the static mixing the liquid/liquid centrifugation; and 4) a photoresist solvent; to form the photoresist composition. As used herein, the phrase "speed enhancing composition" refers to a composition that improves the photospeed of a resist composition. Typically such compositions comprise low molecular weight monomers and/or oligomers that improve the photospeed of the photoresist composition.

The photosensitive component is well known to those of ordinary skill in the art. Suitable photosensitive compounds include o-quinone diazides, as demonstrated by "Light Sensitive Systems", Kosar, J.; John Wiley & Sons, New York, 1965 Chapter 7.4. Other examples of photosensitive compounds include photoacid generators such as onium salts, hydroxymaleimide triflates and diazonium sulfonates. The photoresist solvent can comprise any of those disclosed hereinabove as the first solvent system.

The present invention also provides a method for producing a photoresist composition, the method comprising providing an admixture of: 1) a film forming resin; 2) a photosensitive component in an amount sufficient to photosensitize the photoresist composition, said photosensitive component comprising a sulfonate ester made by reacting low molecular weight oligomers of a film forming resin, the oligomers comprising hydroxyl groups, and made by the aforementioned method utilizing static mixing and centrifugation in the liquid/liquid centrifuge with a diazonaphthoquinone sulfonyl chloride; and 4) a photoresist solvent; to form the photoresist composition.

The esterification reaction between the low molecular weight oligomers of the film forming resin comprising reactive hydroxyl groups and the diazonaphthoquinone sulfonyl chloride is typically a partial esterfication reaction, in which not all of the reactive hydroxyl groups are reacted with the acid chloride functionality of the diazonaphthoquinone compound. Thus the mole or equivalent ratios of the two reactants are carefully chosen to control the extent of the esterification reaction. In one embodiment, the extent of esterification ranges from 5 to 90%, and in one embodiment from 10 to 70%.

Optional Ingredients

Optional ingredients for the photoresist compositions of the present invention include colorants, dyes, anti-striation agents, leveling agents, plasticizers, adhesion promoters, speed enhancers, solvents and such surfactants as non-ionic surfactants, which may be added to the solution of the film forming resin, sensitizer and solvent before the photoresist composition is coated onto a substrate. Examples of dye additives that may be used together with the photoresist compositions of the present invention include Methyl Violet 2B (C.I. No. 42535), Crystal Violet (C.I. 42555). Malachite Green (C.I. No. 42000), Victoria Blue B (C.I. No. 44045) and Neutral Red (C.I. No. 50040) at one to ten percent weight levels, based on the combined weight of the film forming resin and sensitizer. The dye additives help provide increased resolution by inhibiting back scattering of light off the substrate.

Anti-striation agents may be used at up to a five percent weight level, based on the combined weight of the film forming resin and sensitizer. Plasticizers which may be used include, for example, phosphoric acid tri-(beta-chloroethyl)-ester; stearic acid; dicamphor; polypropylene; acetal resins; phenoxy resins; and alkyl resins, at one to ten percent weight levels, based on the combined weight of the film forming resin and sensitizer. The plasticizer additives improve the coating properties of the material and enable the application of a film that is smooth and of uniform thickness to the substrate.

Adhesion promoters which may be used include, for example, beta-(3,4-epoxy-cyclohexyl)-ethyltrimethoxysilane; p-methyl-disilane-methyl methacrylate; vinyl trichlorosilane; and gamma-amino-propyl triethoxysilane, up to a 4 percent weight level, based on the combined weight of the film forming resin and sensitizer. Development speed enhancers that may be used include, for example, picric acid, nicotinic acid or nitrocinnamic acid up to a 20 percent weight level, based on the combined weight of the film forming resin and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhances will also cause a larger loss of photoresist coating from the unexposed areas.

The solvents may be present in the overall composition in an amount of up to 95% by weight of the solids in the composition. Solvents, of course, are substantially removed after coating of the photoresist solution on a substrate and subsequent drying. Non-ionic surfactants that may be used include, for example, nonylphenoxy poly(ethyleneoxy) ethanol; octylphenoxy ethanol at up to 10% weight levels, based on the combined weight of novolak and sensitizer.

Method for Producing a Microelectronic Device

The present invention also provides a method for producing a microelectronic device by forming an image on a substrate, said method comprising:

a) providing a photoresist composition produced by the any of the aforementioned methods, i.e. the aforementioned photoresist composition comprising the fractionated film forming resin, the photoresist composition comprising the speed enhancing composition, or the photoresist composition comprising the ester.

b) thereafter, coating a suitable substrate with the photoresist composition from step a);

c) thereafter, heat treating the coated substrate until substantially all of solvent is removed; image-wise exposing the coated substrate; and then removing the image-wise exposed or, alternatively, the unexposed areas of the coated substrate with a suitable developer.

Substrates suitable for the present invention include silicon, aluminum, polymeric resins, silicon dioxide, doped silicon dioxide, silicon nitride, tantalum, copper, polysilicon, ceramics, aluminum/copper mixtures; gallium arsenide and other such Group III/N compounds.

The photoresist compositions produced by the described procedure are particularly suitable for application to thermally grown silicon/silicon dioxide-coated wafers, such as are utilized in the production of microprocessors and other miniaturized integrated circuit components. An aluminum/aluminum oxide wafer can also be used. The substrate may also comprise various polymeric resins, especially transparent polymers such as polyesters. The substrate may have an adhesion promoted layer of a suitable composition, such as one containing hexa-alkyl disilazane, preferably hexamethyl disilazane (HMDS).

The photoresist composition can be applied to the substrate by any conventional method used in the photoresist art, including dipping, spraying, whirling and spin coating. When spin coating, for example, the resist solution can be adjusted with respect to the percentage of solids content, in order to provide a coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds.

The photoresist composition is coated onto the substrate, and the coated substrate is heat treated until substantially all of the water-immiscible solvent is removed. In one embodiment, heat treatment of the coated substrate involves heating the coated substrate at a temperature from 70° C. to 110° C. for from 30 seconds to 180 seconds on a hot plate or for from 15 to 90 minutes in a convection oven. This temperature treatment is selected in order to reduce the concentration of residual solvents in the photoresist composition, while not causing substantial thermal degradation of the photosensitizer. In general, one desires to minimize the concentration of solvents and this first temperature treatment is conducted until substantially all of the solvents have evaporated and a thin coating of photoresist composition, on the order of one micron in thickness, remains on the substrate. In a preferred embodiment the temperature is from 85° C. to 95° C. The treatment is conducted until the rate of change of solvent removal becomes relatively insignificant.

The temperature and time selection depends on the photoresist properties desired by the user, as well as the equipment used and commercially desired coating times.

The coated substrate can then be exposed to actinic radiation, e.g., ultraviolet radiation, at a wavelength of from 300 nm to 450 nm, x-ray, electron beam, ion beam or laser radiation, in any desired pattern, produced by use of suitable masks, negatives, stencils, templates, etc.

The substrate coated with the photoresist composition is then optionally subjected to a post exposure second baking or heat treatment, either before or after development. The heating temperatures may range from 90° C. to 120° C., more preferably from 100° C. to 110° C. The heating may be conducted for from 30 seconds to 2 minutes, more preferably from 60 seconds to 90 seconds on a hot plate or 30 to 45 minutes by convection oven.

The exposed photoresist-coated substrates are developed to remove the image-wise exposed areas (positive photoresists), or the unexposed areas (negative photoresists), by immersion in an alkaline developing solution or developed by a spray development process. The solution is preferably agitated, for example, by nitrogen burst agitation. The substrates are allowed to remain in the developer until all, or substantially all, of the photoresist coating has dissolved from the exposed or unexposed areas. Developers may include aqueous solutions of ammonium or alkali metal hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution. The photoresist compositions of the present invention are resistant to acid-base etching solutions and provide effective protection for the unexposed photoresist-coating areas of the substrate.

EXAMPLES

The following specific examples will provide detailed illustrations of the methods of producing and utilizing compositions of the present invention. These examples are to intended, however, to limit or restrict the scope of the invention in any way and should not be construed as providing conditions, parameters or values which must be utilized exclusively in order to practice the present invention. Unless otherwise specified, all parts and percents are by weight, all temperatures are in degrees Centigrade, and all molecular weights are weight average molecular weight. The unit "ml/min" indicates is an abbreviated form for milliliters/minute.

Example 1

A static mixing assembly (about 4 feet long; tube diameter approximately 0.375 inch (0.952 cm) to about 0.5 inch (1.27 cm)) is set up and 2 parts of a 30% novolak resin solution (made by dissolving 500 grams of a proprietary novolak resin (MPT-542, available from AZ Electronic Materials, Clariant Corporation, Somerville, N.J.) that is an acid-catalyzed condensation product of m-cresol, p-cresol and 2,3,5-trimethylphenol with formaldehyde in 2000 grams of ethyl lactate) and 1 part of n-hexane is run through an in-line static mixing assembly (actual flow rates: approximately 150 ml/min. for the resin solution; 118 ml/min for the hexane (ratio of resin solution feed rate to hexane is 1:0.5 by weight). Based on the flow rates, the mixing time in the static mixing assembly is about 24 seconds. The mixture exiting from the static mixing tube (assembly) is used as the heavy phase inlet for a CINC Model V-2 liquid/liquid centrifuge. The light phase inlet for the centrifuge is n-hexane, which is fed into the liquid/liquid centrifuge at 59 ml/min. The ratio of the feed rates on a weight basis for resin solution to hexane (going to in-line mixer) to hexane (going to the centrifuge) corresponds to 1:0.5:0.25. The rotational speed of the centrifuge is 3500 rpm.

Example 2

The light phase coming out of the liquid/centrifuge in Example 1 is distilled to remove solvents. The resulting solid residue is dried under vacuum at 60° C. overnight. The resulting solid is pulverized into a fine powder and dried overnight at 400° C. and about 20 mm Hg (torr). Size exclusion chromatography (also known as gel permeation chromatography (GPC)) measurements indicated the weight average molecular weight (M,) to be about 600 (corresponding to about 6 repeating units, i.e., hexamer). The solid oligomeric material of Example 2 is formulated into an i-line (365 nm) resist as an added speed enhancing material in addition to the bulk phenol/formaldehyde resin used as the primary binder (film forming resin). This resist is compared directly with a control resist formulation containing the same resin and the same composition except that a standard speed enhancing additive is used instead of the novolak resin oligomers, as shown in Table 1 below.

TABLE 1

Use of oligomeric fractions as a speed-enhancing additive

| Ingredients | Formulation A (Control) % by weight | Formulation B % by weight |
| --- | --- | --- |
| NK 280[1] | 4.04 | 4.04 |
| NK 240[2] | 1.68 | 1.68 |
| Novolak resin[3] | 13.82 | 13.82 |
| BI26-SX[4] | 2.46 | — |
| Novolak resin oligomers (Example 2) | — | 2.46 |
| Ethyl lactate | 66.30 | 66.30 |
| n-butyl acetate | 11.70 | 11.70 |

[1]A proprietary photoactive component (available from Nippon Zeon Chemical Co.) comprising a partially esterified product made by reacting 1,2-diazonaphthoquinone 5-sulfonyl chloride with a phenolic oligomer;
[2]same as NK 280 except that the degree of esterification is less than that of NK 280;
[3]proprietary novolak resin as described in Example 1 (MPT-542, available from AZ Electronic Materials, Clariant Corporation, Somerville, N.J.);
[4]a proprietary speed enhancer available from Nippon Zeon Chemical Co. that is a phenolic compound.

Each formulation is spin coated onto hexamethyl disilazane treated silicon wafers to the same coating thickness (normally 1 micron). When exposed through a test mask and developed with an AZ® MIF developer, the wafers are compared for photospeed, depth of focus and resolution. Formulation B shows comparable photospeed (255 mJ/cm$^2$ compared to 240 mJ/cm$^2$ for Formulation A), comparable depth of focus (0.8 μm for both Formulations A and B) and resolution (both formulations resolving lines down to 0.32 μm).

Example 3

Fifteen grams of novolak resin oligomers in the form of dried solids from the light phase extract of the centrifuge obtained according to the method of Examples 1 and 2 is dissolved in 60 grams of gamma butyrolactone along with 1.7 grams of 1,2-diazonaphthoquinone 5-sulfonyl chloride. The solution is cooled to 10° C. in a chilled water-jacketed flask. Thereafter, 1.0 gram of n-methylmorpholine is slowly added to the solution and the solution is mixed for 5 minutes at 10° C. The chilled water is turned off and the solution is heated to 30° C. and held at this temperature for 4 hours with rapid agitation. The solution is neutralized by the addition of 1 gram acetic acid at a temperature of 10° C. The resulting salts are filtered off and the filtrate is precipitated by adding it at 10° C. to a mixture of 500 ml deionized water and 60 ml methanol. An amorphous mass precipitates out. The solid mass is isolating by decanting the liquid. The solid residue is dissolved in methanol and reprecipitated by adding the methanol solution slowly to chilled deionized water giving a granular yellow/brown precipitate. The solids are isolated by filtration and are dried in a vacuum oven at 20–25 mm Hg and about 40–50° C. About 14.8 grams of esterified resin is obtained. The calculated degree of esterification was about 5–10% based upon the stoichiometry of the reactants for the esterification reaction.

This esterified resin of Example 3 is used as the photoactive component (PAC) in a positive photoresist composition comprising 30% of formulation D and 70% formulation C of Table 2 and is directly compared to the control photoresist composition (formulation C) with the components used at the same concentrations.

TABLE 2

Formulations used in evaluating the esterified resin of Example 3 as a photoactive component.

| Ingredients | Formulation C (Control) % by weight | Formulation D % by weight |
|---|---|---|
| NK 280[1] | 4.04 | — |
| NK 240[2] | 1.68 | — |
| Novolak resin[3] | 13.82 | 13.82 |
| BI26-SX[4] | 2.46 | 2.46 |
| Esterified novolak resin oligomers (Example 3) | — | 5.72 |
| Ethyl lactate | 66.30 | 66.30 |
| n-butyl acetate | 11.70 | 11.70 |

[1–4]See footnotes from Table 1

The photoresist compositions comprising the mixture of Formulation C and D are spin coated onto a hexamethylated disilazane treated silicon wafer and imaged after drying the coating using ultraviolet exposure through a photomask under identical conditions. When coated, exposed and developed, a usable resist was obtained, indicating the usefulness of the oligomeric resin product as a photoactive component.

Example 4

Figure 2:
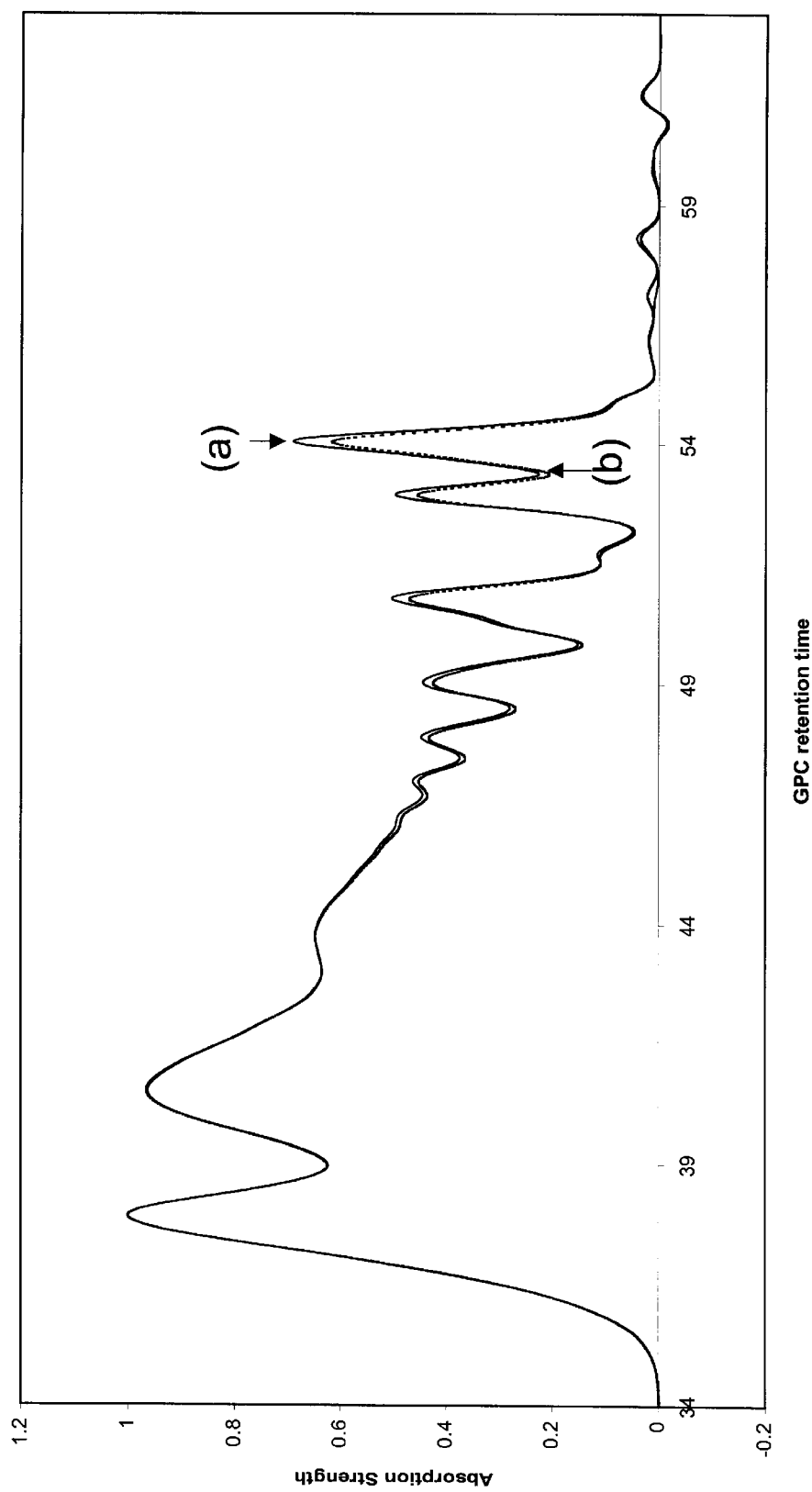
FIG. 2 shows the GPC traces of an unfractionated novolak resin (a) and a fractionated novolak resin (b) obtained without using a static mixture of the present invention, and using hexanes as the second solvent system.

FIGS. 1 and 2 illustrates the advantages of the present invention employing an in-line static mixer. In FIG. 1 are shown GPC traces of an unfractionated novolak resin (curve (a)) and the same resin when fractionated (curve (b)) to remove low molecular weight oligomers according to the present invention using hexanes as the second solvent system, and a weight ratio of resin solution (20% in PGMEA) to hexanes of 1:1 used in static mixing. The novolak resin used is a proprietary material (SPNA400, available from AZ Electronic Materials, Clariant Corporation, Somerville, N.J.) comprising the condensation product of formaldehyde and a mixture of m-cresol, p-cresol, 2,5-dimethylphenol and 2,4-dimethylphenol in the presence of a catalytic amount of oxalic acid. The weight average molecular weight ($M_w$) of the both the unfractionated (pristine) and the fractionated resins are approximately 6100 (using polystyrene standards). The unfractionated resin has a polydispersity (weight average molecular weight/number average molecular weight, $M_w/M_n$) of 4.81, whereas the polydispersithy of the fractionated resin is 4.48. In FIG. 2 are shown the same traces except that no static mixers are employed, i.e., the film forming resin solution and the second solvent system are fed directly into the liquid/liquid centrifuge for separation of the low molecular weight oligomers from the high molecular weight fractions. Here again, curve (a) represents the unfractionated resin and curve (b) the fractionated resin. The unfractionated resin has an $M_w$ of 6109 and a polydispersity of 4.73 while the fractionated resin has an $M_w$ of 6328 and a polydispersity of 4.10. From FIG. 1, it is clearly seen that the intensity of the low molecular weight oligomeric peaks (appearing at higher retention times) of the fractionated resin are considerably less than the intensity of these peaks in the unfractionated original resin. On the other hand, in FIG. 2, the intensity of the oligomeric peaks of the fractionated resin are only slightly less than the intensity of these peaks in the unfractionated resin. This indicates that the present process employing the static mixer is more efficient in removing low molecular weight oligomers from the film forming resin than the corresponding process not employing the static mixer.

Example 5

Figure 3:
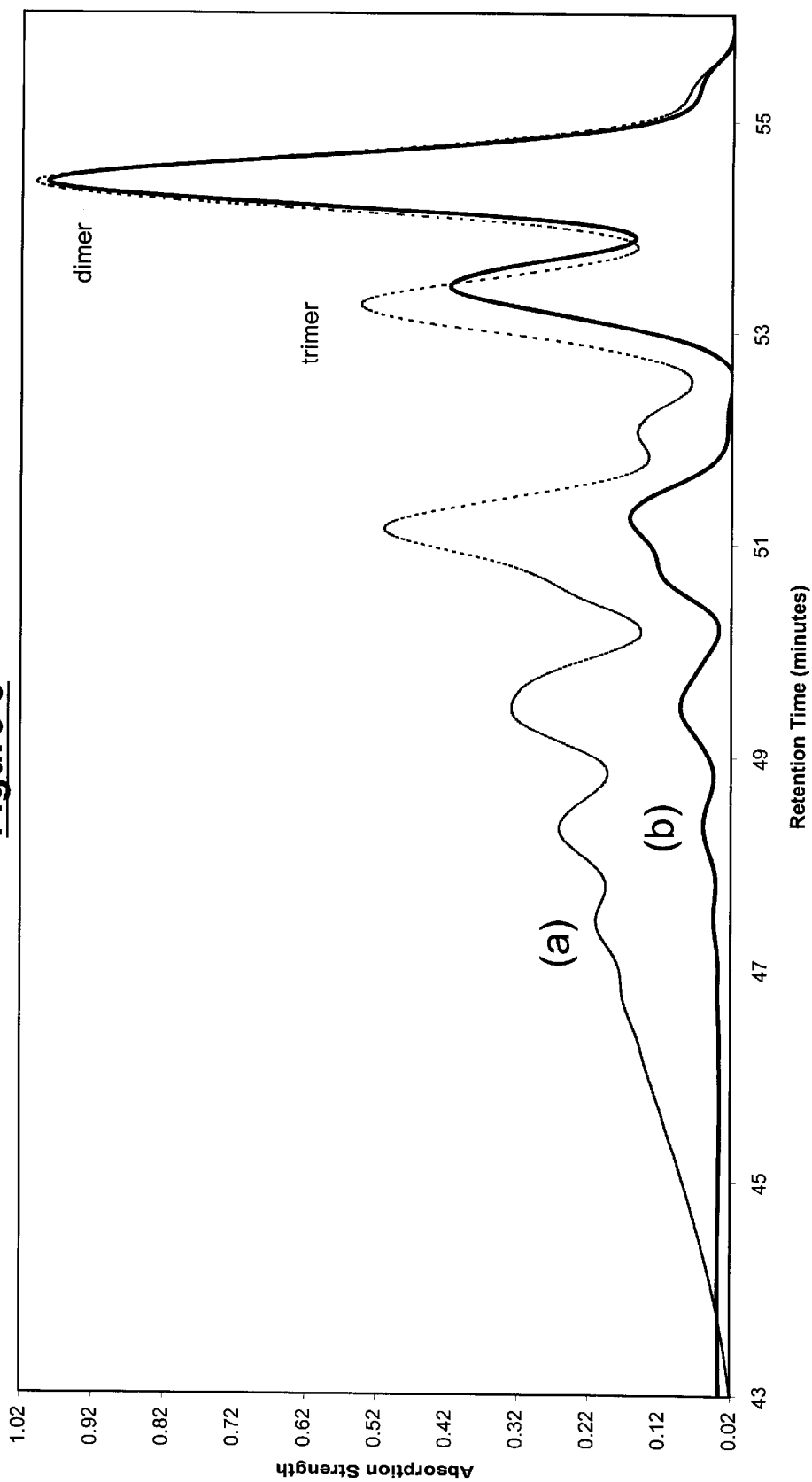
FIG. 3 shows the GPC traces of low molecular weight oligomeric fractions of a novolak resin collected in the light phase fraction of the liquid/liquid centrifuge of the present invention. Curve (a) is a GPC trace using hexanes as the second solvent system of the present invention, while curve (b) is a GPC trace using 25% methanol in ill water as the second solvent system.

FIG. 3 also illustrates the utility of the present invention in selectively removing dimers and trimers from a novolak resin using 25% methanol in water as the second solvent system. The novolak resin used is the same proprietary resin as that of Example 4. Curve (a) is a GPC curve of the low molecular weight fractions collected in the light phase layer using the present method, employing hexanes as the second solvent system and using a mixture of 20% resin solution in PGMEA (first solvent system) and hexanes in the static mixer, the weight ratio of the resin solution to hexanes being 1:1. Curve (b) is a GPC curve of the same low molecular weight fraction, but employing 25% methanol in water as the second solvent system, and using a mixture of 20% resin solution in PGMEA and 25% methanol in water in the static mixer, the weight ratio of the resin solution to 25% methanol in water being 1:1. The intensity of the dimer and trimer peaks relative to the intensity of the other oligomer peaks is more enhanced in curve (b) than in curve (a), indicating the effectiveness of the 25% methanol/water mixture in selectively removing dimers and trimers from the novolak resin. In addition, using the present method, one can obtain desired fractionated resins with yields of 80–95% (i.e., starting with a pristine (unfractionated) resin, one can employ the methanol/water solvent to selectively remove oligomers comprising dimers and trimers to yield a desired fractionated resin whose yield is 80–95% based on the weight of the starting unfractionated resin).

Example 6

Same as example 1, except that the proprietary novolak resin is replaced with the following novolak resin. A novolak resin is synthesized by condensing formaldehyde with a mixture of 55% meta-cresol and 45% para-cresol at a ratio of 0.7 mole of formaldehyde to 1 mole of total cresols (meta cresol plus para cresol). The reaction is run with about 0.3% (by weight of solids) of an oxalic acid catalyst. After reacting the mixture for about 6 hrs. at 90–95° C., the mixture is distilled at a temperature up to about 200° C., and then at 200° C. with 25–30 mm Hg vacuum, to remove unreacted cresols. The molten novolak resin is then poured into a crystallizing dish and allowed to cool. The solidified resin is then broken up and powdered by grinding the resin with a mortar and pestle.

Each of the documents referred to above is incorporated herein by reference in its entirety, for all purposes. Except in the Examples, or where otherwise explicitly indicated, all numerical quantities in this description specifying amounts of materials, reaction and process conditions (such as temperature, time, pressure), feed ratios, rotational speeds of centrifuge, and the like are to be understood to be modified by the word "about".

What is claimed is:

1. A method for separating and isolating low molecular weight oligomers of a film forming resin, said method comprising:
   a) providing a solution of the film forming resin in a first solvent system comprising a photoresist solvent, and optionally a water-soluble organic polar solvent, wherein the ratio of the photoresist solvent to the water soluble organic polar solvent ranges from about 10/90 to about 100/0;
   b) providing a second solvent system comprising at least one substantially pure $C_5$–$C_8$ alkane and/or at least one alkyl aromatic hydrocarbon solvent and/or water/$C_1$–$C_4$ alcohol mixture provided that the $C_1$–$C_4$ alcohol content of the water/$C_1$–$C_4$ alcohol mixture is less than 50% by weight; and performing steps c)–e) below in the following order:
   c) mixing the solutions from a) and the second solvent system from b) in a static mixer for a time period sufficient for efficient mixing;
   d) feeding the mixture from c) and the second solvent system from b) through two separate inlet ports into a liquid/liquid centrifuge, one of said inlet ports feeding the mixture from c), the second inlet port feeding the second solvent system from b) into said liquid/liquid centrifuge at a feed ratio of the mixture from c) to the second solvent system from b) of from about 10/90 to about 90/10, at a temperature of from about 0° C. up to a maximum temperature that is less than the boiling point of the lowest boiling solvent in the first or second solvent system;
   e) rotating the mixture from step d) inside the liquid/liquid centrifuge at a rotational speed sufficient to separate the mixture from step d) into two separate phases, and then collecting the two separate phases, each from two separate outlet ports, into two separate containers, wherein the heavier phase (H) comprises a fractionated film forming resin comprising higher molecular weight fractions of the film forming resin, in the first solvent system with a minor amount of the second solvent system, and the lighter phase (L) comprises low molecular weight oligomers of the film forming resin in the second solvent system with a minor amount of the first solvent system.

2. The process of claim 1, further comprising removing the second solvent system from the lighter phase (L) from step e) and leaving the low molecular weight oligomers of the film forming resin dissolved in the first solvent system.

3. The method of claim 1 wherein the film forming resin is at least one member selected from the group consisting of novolak resins, polyhydroxystyrenes and derivatives thereof.

4. The method of claim 1 wherein in step a), the photoresist solvent comprises a monooxymonocarboxylic acid ester, a propylene glycol methyl ether acetate, 2-heptanone, a propylene glycol methyl ether, or a mixture of at least two thereof.

5. The method of claim 1 wherein in step a), the water-soluble polar solvent is at least one member selected from the group consisting of acetone, dimethylformamide, dimethylsulfoxide, tetrahydrofuran, ethylene glycol, and a $C_1$–$C_5$ alkyl alcohol.

6. The method of claim 1 wherein in step b), the alkyl aromatic hydrocarbon solvent is at least one member selected from the group consisting of dimethylbenzene and dibutylbenzene.

7. The method of claim 1 wherein in step c), the static mixer in an in-line mixer.

8. The method of claim 1 wherein in step c), the time period sufficient for efficient mixing is at least 6 seconds.

9. The method of claim 1 wherein in step d), the mixture from step c) and the second solvent system from step b) are fed into the liquid/liquid centrifuge at a temperature of from about 0° C. to about 10° C. less than the boiling point of the lowest boiling solvent in the first or second solvent system.

10. The method of claim 1 wherein in step e), the mixture from step d) is rotated at a speed of from about 500 to about 50,000 rpm.

11. The method of claim 3, wherein the novolak resin is made by condensing formaldehyde, paraformaldehyde or formalin with one or more phenolic compounds, in the presence of an acid catalyst or a reactive equivalent of said catalyst.

12. The method of claim 11, wherein the phenolic compounds comprise m-cresol, p-cresol, and 2,3,5-trimethylphenol.

13. The method of claim 11, wherein the phenolic compounds comprise m-cresol, p-cresol, 2,4- and 2,5-dimethylphenol.

14. The method of claim 11 wherein the acid catalyst or its reactive equivalent is at least one member selected from the group consisting of oxalic acid, maleic acid, maleic anhydride, p-toluenesulfonic acid and sulfuric acid.

15. The method of claim 13 wherein in step a), the first solvent system comprises propylene glycol methyl ether acetate, in step b), the second solvent system comprises 25% methanol in water, and in step e), the lighter phase comprising the low molecular weight oligomers of the film forming resin comprises a mixture of dimers and trimers, that is at least 20% by weight of the low molecular weight oligomers.

* * * * *